United States Patent [19]
Yoshida et al.

[11] 4,106,044
[45] Aug. 8, 1978

[54] FIELD EFFECT TRANSISTOR HAVING UNSATURATED CHARACTERISTICS

[75] Inventors: Takashi Yoshida, Hamamatsu; Masao Kosugi, Hamakita; Takeshi Matsuyama, Hamamatsu, all of Japan

[73] Assignee: Nippon Gakki Seizo Kabushiki Kaisha, Hamamatsu, Japan

[21] Appl. No.: 801,248

[22] Filed: May 27, 1977

Related U.S. Application Data

[63] Continuation of Ser. No. 558,697, Mar. 17, 1975, abandoned.

[30] Foreign Application Priority Data

Mar. 16, 1974 [JP] Japan .................. 49-29616
Apr. 6, 1974 [JP] Japan .................. 49-38473

[51] Int. Cl.² .......................................... H01L 29/78
[52] U.S. Cl. ........................................ 357/22; 357/55; 357/56
[58] Field of Search ...................... 357/22, 55, 56

[56] References Cited

U.S. PATENT DOCUMENTS

| 3,328,213 | 6/1967 | Topas et al. .................. 357/22 |
| 3,381,188 | 4/1968 | Zuleeg et al. ................. 357/22 |
| 3,497,777 | 2/1970 | Teszner ........................ 357/22 |
| 3,675,313 | 7/1972 | Driver et al. ................. 357/22 |
| 3,767,982 | 10/1973 | Teszner et al. .............. 357/22 |
| 3,828,230 | 8/1974 | Nishizawa et al. ........... 357/22 |

FOREIGN PATENT DOCUMENTS

| 1,326,520 | 1963 | France .......................... 357/22 |
| 2,220,789 | 1972 | Fed. Rep. of Germany ... 357/22 |
| 1,070,519 | 1967 | United Kingdom ........... 357/22 |

OTHER PUBLICATIONS

IBM Tech. Bul, vol. 13, No. 6, Nov. 1970, Jadus.
"Neus Aus der Technik".
Solid State Electronics, 1967, vol. 10, pp. 559–576.

*Primary Examiner*—Edward J. Wojciechowicz
*Attorney, Agent, or Firm*—Cushman, Darby & Cushman

[57] ABSTRACT

A field effect transistor having unsaturated characteristics comprising a plurality of current channels consisting of a semiconductor material of an impurity concentration between $1 \times 10^{13}$ to $1 \times 10^{15}$ atoms/c.c., each current channel having a minimum diameter between 2 and 15 μm so that the depletion layer growing from the gate junction nearly but not perfectly closes the current channel at zero gate bias. This junction type field effect transistor provides unsaturated and well aligned parallel characteristic curves and reduces power loss as compared to conventional unsaturated type vertical field effect transistors.

12 Claims, 36 Drawing Figures

FIELD EFFECT TRANSISTOR HAVING UNSATURATED CHARACTERISTICS

RELATED APPLICATION

This application is a continuation of our copending application Ser. No. 558,697 filed 3-17-75 which was abandoned upon the filing hereof.

BACKGROUND OF THE INVENTION

1. Field of the invention:

This invention relates to a field effect transistor and the method of making same, and more particularly to a junction type field effect transistor having unsaturated characteristics and the method of making same.

2. Description of the prior art:

The depletion layer has long been investigated and utilized in semiconductor devices. But, there still remain properties not fully analyzed. Thus the concept of the depletion layer will first be described briefly.

When a p-type region and an n-type region are located contiguous to each other in a semiconductor bulk, a pn-junction is formed, whereat the respective carriers (holes and electrons) are quite different in their densities from one side to the other side, the hole density being much larger in the p-type region than in the n-type region and the electron density being much larger in the n-type region than in the p-type region. Therefore, in the vicinity of the pn-junction, the holes tend to move from the p-type region into the n-type region across the pn-junction while the electrons travel from the n-type region into the p-type region. Thus, a negatively-charged portion is formed in the p-type region near the pn-junction. Likewise, a positively changed portion is formed in the n-type region near the pn-junction. Thus, there is formed an electrical double layer. Once such a double-layer is formed, it establishes a potential gradient to prevent further inter-regional travels of charge carriers. Such a double-layer region is called a space charge region or a depletion layer. Such depletion layers have been effectively utilized in field effect transistors.

In conventional junction type field effect transistors, carrier channels, where charge carriers are transported, are usually defined and controlled by a depletion layer extending from a pn-junction surrounding the gate region. Such conventional field effect transistors, however, showed saturated characteristics in the drain current vs. drain voltage relation.

Recently, an unsaturated, triode-like field effect transistor has been proposed (e.g. U.S. Pat. No. 3,828,230 to Nishizawa & Terasaki). In this unsaturated type field effect transistor, the depletion layer extending from the gate region is designed to close the so-called current channel even at null gate bias. Thus, the charge carriers should penetrate through the depletion layer in going from the source to the drain in every operable state. The charge transfer in the depletion layer was considered just as that in vacuum. The current capacity was considered to be proportional to the cross section of the current channel. According to this concept, for achieving a large current capacity field effect transistor, the channel area should preferably be as large as possible. For closing such a large channel area, the carrier concentration in the current channel should be less than a certain value and preferably be as low as possible. In other words, the lower the impurity concentration in the semiconductor region which forms a current channel is, the larger the current that would be allowed to pass.

When one applies the above concept to the vertical multi-channel junction type field effect transistor as proposed in U.S. Pat. No. 3,381,188, it would be possible to provide a large power active elements. But an increase in the cross-section of each current channel should be accompanied by a corresponding decrease in impurity concentration and leads to a larger internal resistance, i.e. drain resistance, and a smaller amplification factor.

Further, the use of an extremely pure semiconductor material makes the practical manufacturing process of devices very difficult because a very little amount of the extrinsic material may wholly change the electric characteristics of the material.

Further the zero gate bias characteristic curve in the drain current to drain voltage relation according to the above structure is separated from the current axis by a considerable amount. This means a high "ON" resistance and a loss in power.

This invention is to solve these problems and to provide a practically useful structure for an unsaturated type field effect transistor which is easy to manufacture, and a method of making same.

SUMMARY OF THE INVENTION

An object of this invention is to provide a field effect transistor which is easy to manufacture, having unsaturated characteristics, high breakdown voltage, low distortion, high transconductance and high current capacity.

Another object of this invention is to provide a field effect transistor having at least one current channel of an impurity concentration of $1 \times 10^{13}$ to $1 \times 10^{15}$ atoms/c.c. and a channel width of 2 to 15 μm, both of which can be achieved with good reproducibility, and a method of making same.

According to an embodiment of this invention, there is provided a field effect transistor including a source, a gate and a drain electrode, a semiconductor region of one conductivity type connecting said source and drain electrodes, a gate semiconductor region of another conductivity type, comprising:

a current channel consisting of a portion of said semiconductor region adjacent to said gate region having an impurity concentration from $1 \times 10^{13}$ to $1 \times 10^{15}$ atoms/c.c., and a depletion layer growing from the junction between said gate semiconductor region and said semiconductor region and extremely narrowing the neutral region (i.e. carrier- xisting region) of said semiconductor region of one conductivity type when no gate bias voltage is applied to said gate electrode.

According to another aspect of the present invention, there is provided a method of making a field effect transistor comprising the steps of:

growing one epitaxial semiconductor layer of one conductivity type and an impurity concentration between $5 \times 10^{13}$ to $5 \times 10^{14}$ atoms/c.c. on a semiconductor substrate of the same conductivity type but with a larger impurity concentration;

forming a semiconductor gate region of the opposite conductivity type having a mesh structure provided with a plurality of apertures having a minimum diameter between 2 and 15 μm;

growing another epitaxial layer of said one conductivity type and a lower impurity concentration than that of said one epitaxial layer on said one epitaxial layer; and connecting electrodes to said substrate, said gate region and said another epitaxial layer.

BRIEF DESCRIPTION OF THE DRAWINGS

Further description of the present invention will be made in conjunction with the accompanying drawings in which.

DETAILED DESCRIPTION OF THE PREFERRED EMBODIMENTS

Figure 1:
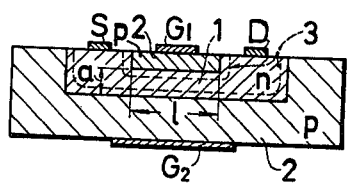
FIG. 1 is a cross-sectional view of a conventional horizontal type field effect transistor.
Figure 2:
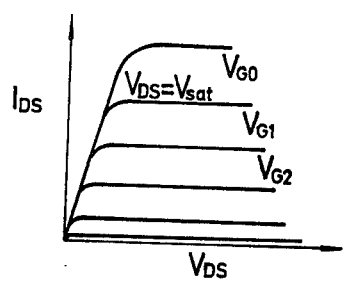
FIG. 2 is a graph of typical drain current vs. drain voltage characteristic curves of the conventional field effect transistor of FIG. 1.
Figure 3:
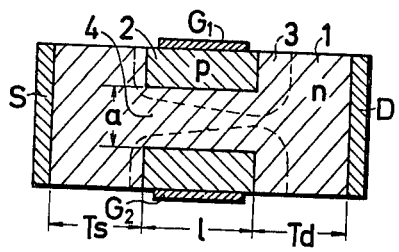
FIG. 3 is a schematic cross-sectional diagram of a field effect transistor.

FIG. 1 shows an example of a conventional horizontal field effect transistor in which an n-type current channel 1 is formed in parallel relation with a principal surface of the element. A p-type gate region 2 is formed in the current channel so as to reduce the cross-sectional area of the current channel 1. A pn-junction is formed between the channel region 1 and the gate region 2. When a reverse gate potential is applied, a depletion layer 3 grows to control the cross-sectional area of the true current channel (non-depleted regon). The characteristic curves of such a conventional field effect transistor are shown in FIG. 2. The source-to-drain current is saturated with respect to the source-to-drain voltage. The reason for this saturation had long been unknown, but recently it was found to be caused by the increasing drain resistance. This will be described in more detail while referring to FIG. 3. In FIG. 3, the current channel 1 is defined by the depletion layer 3 extending from the pn-junction around the gate region 2. When a reverse voltage is applied to the gate G1 and G2, the depletion layer 3 grows larger, and the current path 4 sandwiched by the depletion layer 3 becomes thinner and longer. Since the resistance of the current path 4 is proportional to the cross-sectional area and inversely proportional to the length of this path, the resistance of the current path 4 becomes larger as the reverse gate voltage is increased in absolute value. Thie means a simple negative feed-back and provides saturation.

Figure 4:
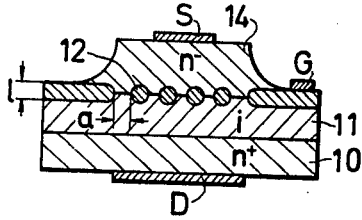
FIG. 4 is a cross-sectional view of a recently proposed vertical type field effect transistor.
Figure 5:
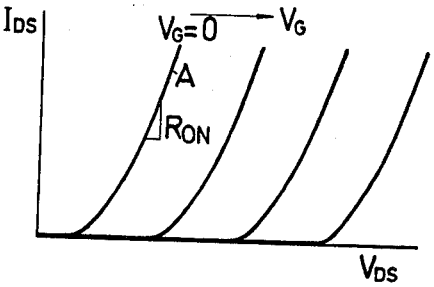
FIG. 5 is a graph of typical drain current vs. drain voltage characteristic curves of the field effect transistor of FIG. 4.

FIG. 4 shows a recently proposed vertical field effect transistor which provides unsaturated characteristics as shown in FIG. 5. In FIG. 4, a nearly intrinsic region 11 ($n^-$ type) is grown on an $n^+$ type substrate 10, and a source region 14 which is deposited on the intrinsic region 11 has a low carrier concentration but is higher than that of the intrinsic region 11. A p-type gate region 12 is formed between the source region 14 and the intrinsic region 11. The gate region has a mesh structure with apertures working as current channels. The diameter of each aperture is so selected that the depletion region growing from the gate region closes (pinches off) the current channel even at null gate bias. Since the current channel is already pinched off, there cannot be formed a long, narrow resistive channel and hence there is no drastic change in the resistance of the current channel. Thus, there is no reason for causing saturation of the characteristic curves.

Typical characteristic curves according to such vertical field effect transistor are shown in FIG. 5. Apparently, no saturation is observed.

In FIG. 5, however, the zero bias curve indicated by A is separated from the ordinate axis by a considerable amount. This means an inevitable loss of power when one wishes to use this element with reverse bias since forward bias will inevitably bring in certain inconvenient problems such as the increase in gate current and distortion.

This invention is to solve mainly these problems and to provide a field effect transistor having excellent unsaturated drain current-to-drain voltage characteristics, such that the zero bias curve of the FET approaches the ordinate (current) axis far nearer than that of the conventional unsaturated type field effect transistor.

The inventors of the present invention first re-examined the basic concepts of the above described vertical field effect transistor of unsaturated characteristics. Referring to FIG. 3, several terms used in this specification are first defined. Source length $T_s$ is defined as the minimum distance between the source electrode (or electrode-like heavily doped region) and the gate region. Channel length $l$ is defined as the length of the gate region along the direction of the current flow. Channel width $a$ is defined as the diameter of the largest inscribed circle of one channel. Drain length $T_D$ is defined as the minimum distance between the drain electrode (or electrode-like heavily doped region) and the gate region. These parameters together with the impurity concentration of the semiconductor bulk are considered to substantially determine the basic characteristics of a field effect transistor.

According to the conventional unsaturated type field effect transistor, the channel width $a$ is so selected that the depletion layers growing from the gate regions substantially close the current path. The gate-to-gate separation is practically limited by the masking technique and preferably is above about 5 $\mu$m. For closing a current path of such dimension, the impurity concentration in the channel region should be kept sufficiently low.

It was considered that the impurity concentration in the channel region is preferably as low as possible. Further, it is considered that as the channel aperture becomes large, the current capacity becomes large accordingly. For forming a large output power element according to this concept, the channel width should be formed large and, for closing such a large width of channel, the carrier concentration should be kept even lower.

At the present stage of the semiconductor crystal growing technique, the formation of a region of a given impurity concentration of $5 \times 10^{13}$ atoms/c.c. is the practical limit and a lower impurity concentration of a given impurity is very difficult to achieve with good reproducibility.

The present inventors have found, however, that if the channel area is increased, the current allowed to pass through the channel does not increase as much as expected. It can be considered that in a depletion layer, charge carriers do not behave in such a manner as in vacuum.

Based on this finding, the present invention proposes the most effective impurity concentration and channel width.

Before making a further description of the present invention, the relationship of the width of the depletion layer to the impurity concentration will be described.

Figure 6:
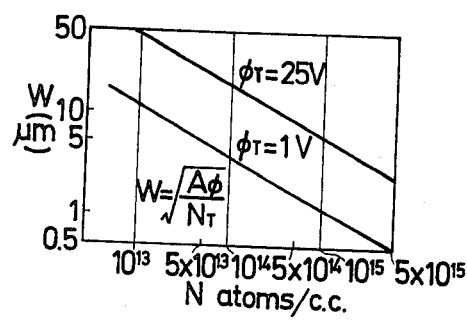
FIG. 6 is a graph showing the relation between the width of the depletion layer and the impurity concentration, the total potential difference across the junction serving as a parameter.

FIG. 6 shows the relationship of the width of the depletion layer to the impurity concentration. In the figure $\phi_T$ denotes the total potential difference across the junction, i.e. (built-in voltage) ÷ (externally applied voltage). As is apparent from the figure, the width of the depletion layer W obeys the following equation;

$$W = \sqrt{(A)/(N)\,\phi_T}$$

wherein: A is a constant determined by the semiconductor material and N the impurity concentration.

When the impurity concentration in the channel region is above $5 \times 10^{14}$ atoms/c.c., and more particularly above $1 \times 10^{15}$ atoms/c.c., the width of the depletion layer is very small. Therefore, the gate-to-gate distance should be designed small, and this fact of arranging the gate-to-gate distance small, in turn, makes it difficult to work out the gate-to-gate distance with precision. This, in turn, is accompanied by the requirement for high grade precision in the gate formation and a lowered ratio of effective channel area to the total semiconductor chip area due to the increase in the area of the gate region. A high impurity concentration as referred to above results in a large variance in the performance characteristics of the transistor. In addition, for increasing the amplification factor, the drain resistance must be high. Then the negative feed-back due to the long narrow conductive region becomes apparent, and the linearity of the characteristics as well as the desired nonsaturability are damaged.

When the impurity concentration is below $5 \times 10^{13}$ atoms/c.c., the depletion layer becomes wide. However, at the present industrial stage, such a region with good yield is very difficult to manufacture. Further, a gate region of a sufficiently high impurity concentration in such low impurity concentration region without changing the initial properties of the channel is also difficult to form.

There is another problem from the aspect of practical use. That is, in the drain current-to-drain voltage characteristics, the "ON" resistance $R_{ON}$ for the zero gate bias has a large significance from the point of power utility. For reducing this "ON" resistace $R_{ON}$, it is preferably to use the state wherein the current path is not closed by the depletion layer. The resistance of such a nondepleted region (neutral region) is inversely proportional to the impurity concentration. Thus, from this point the impurity concentration in the channel region should be as large as possible. If the impurity concentration and the channel width $a$ are both large, however, neither the amplification factor nor the linearity can be improved and the characteristic curves exhibiting a variable resistance will appear.

According to this invention, the impurity concentration in the channel region and the channel width are so selected that the channel region includes a neutral current path at zero gate bias but when a reverse gate bias is increased, the neutral current path vanishes (i.e. current path becomes closed). Further, the characteristic curves are well aligned in parallel and has a small "ON" resistance $R_{ON}$.

The detailed values of the impurity concentration, and the dimensional parameters $a$, $l$, $T_S$ and $T_D$ may vary according to the desired element, but the most important factors are the impurity concentration in the channel region and the channel width $a$. The channel length $l$ and the drain length $T_D$ relate to the drain resistance and hence to the apparent amplification factor. The source length $T_S$ and the drain length $T_D$ relate to the breakdown voltage and should be above certain values.

First, two embodiments for the vertical structure will be described.

Figure 7:
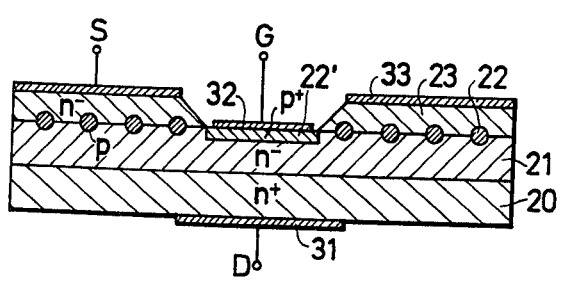
FIG. 7 is a cross-sectional view of an embodiment of the unsaturated type vertical field effect transistor according to the present invention.

FIG. 7 shows an embodiment of a vertical field effect transistor according to this invention, and FIGS. 8a to 8i show the manufacturing steps thereof.

On an $n^+$ type semiconductor substrate 20 of a high conductivity is deposited an $n^-$ type epitaxial layer 21 having an impurity concentration from $5 \times 10^{13}$ to $5 \times 10^{14}$ atoms/c.c., typically $1 \times 10^{14}$ atoms/c.c., to form a high resistivity drain region 21. In the surface of the drain region 21 is formed a mesh-formed gate region 22 having an impurity concentration from $1 \times 10^{18}$ to $5 \times 10^{19}$ atoms/c.c. by known doping techniques. This gate mesh is formed in parallel to a principal surface. On the drain region 21 is provided an $n^-$ type epitaxial source region 23 having an impurity concentration from $1 \times 10^{14}$ to $5 \times 10^{15}$ atoms/c.c., typically $1 \times 10^{15}$ atoms/c.c., except on the gate electrode wiring region 22'. The drain, gate and source electrodes 31, 32 and 33, respectively, are connected on the respective regions.

Figure 10A:
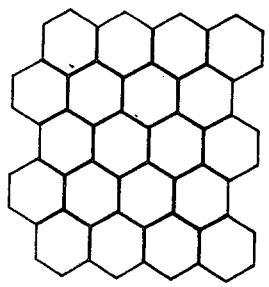
FIGS. 10a to 10c show examples of gate patterns.
Figure 10B:
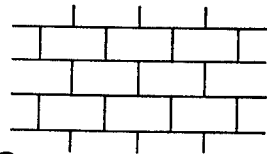
Figure 10C:
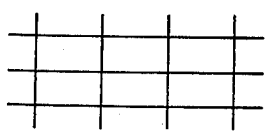

Various gate patterns can be employed in this embodiment. The basic concepts for constructing the gate pattern are that the area of the wafer can be utilized effectively and that the presence of a breakage in the gate pattern still can maintain the electrical connection of the gate region. Some examples of gate pattern are shown in FIGS. 10a to 10c. FIG. 10a is a honeycomb structure, FIG. 10b is a stagger structure, and FIG. 10c is a rectangular lattice. The most important factor in the gate design is the width $a$ of the gate mesh. This width $a$ is so selected that the depletion layer approaches close to each other but will not touch each other.

The manufacturing steps of the field effect transistor of FIG. 7 will be described by referring to FIGS. 8a to 8i.

Figure 8A:
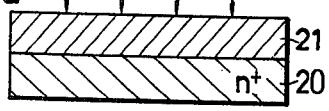
FIGS. 8a to 8i are cross-sectional views showing how the field effect transistor of FIG. 6 is manufactured.
Figure 9:
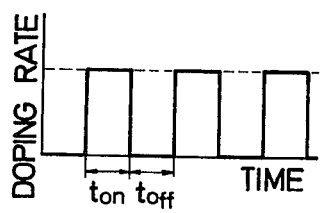
FIG. 9 is a graph showing how a dopant is introduced into a semiconductor material.

An $n^+$ type silicon substrate 20 is prepared. On this $n^+$ type substrate 20, an $n^-$ type epitaxial silicon layer 21 is vapor-deposited using the intermittent doping method (FIG. 8a). The intermittent doping method is the method of intermittently adding the dopant to the carrier gas as is illustrated in FIG. 9. The doping time $t_{ON}$ and the non-doping time $t_{off}$ are appropriately selected, e.g. one minute for each, to form an epitaxial layer of a desired impurity concentration, e.g. $5 \times 10^{13}$ atoms/c.c. According to this method, doped layers and non-doped layers are alternatingly formed in the direction of crystal growth. The thicknesses of the respective layers, however, are so selected that the impurity distribution is levelled uniformly by the thermal diffusion during the crystal growing processes. This method is very effective for forming a semiconductor region of low but precise impurity concentration.

Figure 8B:
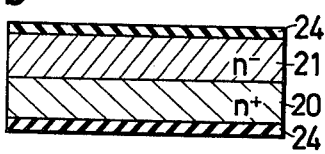
Figure 8C:
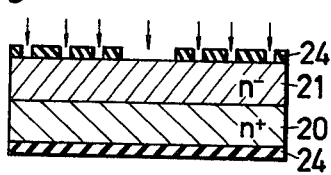
Figure 8D:
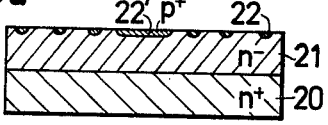
Figure 8E:
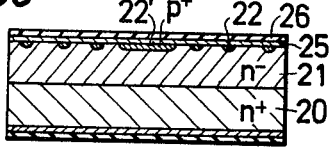
Figure 8F:
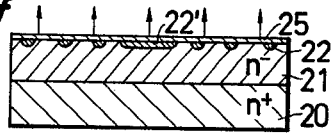
Figure 8G:
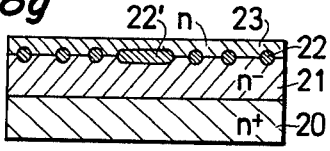
Figure 8H:
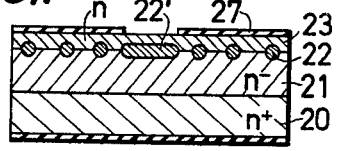
Figure 8I:
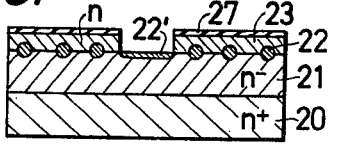

After the $n^-$ type epitaxial layer is grown, the slicon wafers 20 and 21 are subjected to heat treatment in oxygen atmosphere to form silicon dioxide films 24 on the surfaces (FIG. 8b). The dioxide film 24 located on a principal surface is photo-etched to form a mask pattern corresponding to the gate pattern. Through this mask, a p-type-giving impurity such as boron, aluminum, or indium is doped into the epitaxial layer 21 by the thermal diffusion or the ion implantation method to form a p-type semiconductor gate region 22 having an impurity concentration of $1 \times 10^{18}$ to $5 \times 10^{19}$ atoms/c.c. (FIG. 8c). After the formation of the gate region 22, the dioxide films 24 are removed by dissolving in diluted fluoric acid (FIG. 8d). The exposed surface of the epitaxial layer 21 including the gate region 22 is then doped with an evaporable n-type-giving impurity, arsenic or phosphorus, thus forming an impurity-containing silicon layer 25. The semiconductor wafer supporting said silicon layer 25 is subjected to an atmosphere of oxygen and phosphorus. Whereupon, a surface layer 26 of phosphorous glass is formed (FIG. 8e). The n-type thin film 25 has an impurity concentration no greater than that in the surface portion of the gate region 22 and is formed for compensating for the impurity released from the gate region 22. The impurity concentration of this thin film 25 is so selected that at the final stage of the manufacturing steps, there no longer remains any region of such relatively high impurity concentration. This step of FIG. 8e is performed just before the step of removing said phosphorous glass and surface cleaning. This step may be replaced by ion implanation for forming the thin layer 25. Ion implanation can form an impurity doped layer of a thickness of about 0.1 μm very precisely and uniformly. However, according to this latter alternative step, no phosphorous glass is formed, since this step is completely different from the aforesaid step which is a thermal doping process. In the step of FIG. 8e, after removing this phosphorous glass in fluoric acid, the semiconductor wafer is subjected to a heat treatment of about 1200° C in hydrogen atmosphere to clean the surface (FIG. 8f). In this process, the gate impurity tends to diffuse or evaporate, and the thin compensating film 25 works to compensate for the p-type impurity. The impurity concentration of the thin film 25 reduces due to evaporation, diffusion and compensation. After this impurity lessening process in hydrogen atmosphere, a second epitaxial layer 23 is grown up to a thickness of about 5 μm on the first epitaxial layer 21 by introducing thereto mono-silane (SiH$_4$) gas at a temperature of 900° to 1100° C. When this epitaxial layer is grown, the n-type doped region 25 has vanished (FIG. 8g). After the second epitaxial layer 23 is formed, its surface is covered with silicon dioxide. Thereafter, that part of surface of silicon dioxide located above the p-type gate region 22' is etched by known photo-etching technique (FIG. 8h). Then, the resulting exposed surface of the second epitaxial layer 23 is etched by the use of the remaining silicon dioxide layer serving as a mask (FIG. 8i). Then, the electrodes are connected by ordinary techniques. It should be noted that if no expedient is taken to mitigate the undesirable effect accruing from surface diffusion and evaporation of the gate impurity, many of the channel regions will turn into p-type. Then, the element may exhibit bipolar characteristics. In this embodiment, a compensating layer is formed and the temperature for growing the second epitaxial layer is lowered to prevent such undesirable phenomenon from taking place.

In the above embodiment, the gate region is located within the first epitaxial layer 21 by the selective diffusion into this first epitaxial layer. Alternatively, this gate region may be formed on top of the first epitaxial layer by uniformly forming a p-type layer thereon.

More particularly, in FIG. 11 and FIGS. 12a to 12e, an $n^-$ type epitaxial layer 41 having an impurity concentration less than $5 \times 10^{14}$ atoms/c.c. is formed on an $n^+$ type silicon substrate 40 having a high conductivity. This epitaxial layer 41 works as a drain region. On this epitaxial drain region, a gate pattern 42 is formed with a p-type semiconductor epitaxial layer having a high impurity concentration. On these epitaxial layers are formed another epitaxial layer 43 having an impurity concentration not less than that of the drain region. On an electrode wiring gate region 42' is doped a p-type impurity to form a $p^+$ type gate lead-out region 44. The gate potential applied to a gate electrode 52 is transmitted to the gate region 42 through these regions 44 and 42'.

Figure 11:
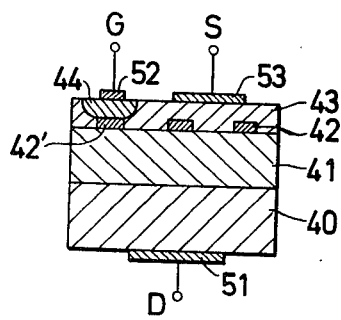
FIG. 11 is a cross-sectional view of another embodiment of the unsaturated type vertical field effect transistor according to this invention.
Figure 12A:
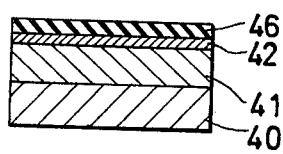
FIGS. 12a to 12e are cross-sectional views showing how the field effect transistor of FIG. 10 is manufactured.
Figure 12B:
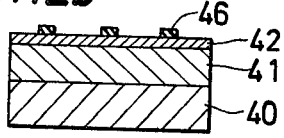
Figure 12C:
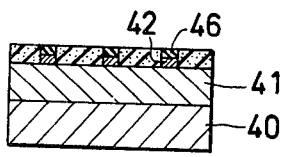
Figure 12D:
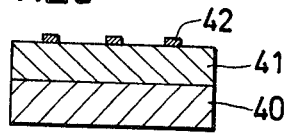

The manufacturing steps for the embodiment of FIG. 11 are illustrated in FIGS. 12a to 12e. An $n^-$ type silicon epitaxial layer 41 is grown on an $n^+$ type silicon substrate 40 similarly to the preceding embodiment. On this $n^-$ type silicon epitaxial layer 41 is formed a $p^+$ type silicon layer 42 by vapor deposition. On the $p^+$ type layer 42, a masking film 46 such as a nitride (Si$_3$N$_4$) film is formed (FIG. 12a). This nitride film 46 is etched to form a pattern of the gate structure (FIG. 12b). Using this nitride film as a mask, the p-type semiconductor layer is selectively oxidized (FIG. 12c). Then, this oxidized p-type semiconductor layer 42 and the nitride film 46 are removed (FIG. 12d). The remaining mesh of the p-type region works as a gate region. Therefore, particular precision is required in this gate formation. By relying on the plasma etching technique, fine strips having a width of 5 μm or less can be reproduced. Here, in place of the selective oxidization, the anisotropic etching technique may be employed depending on the orientation of crystal. In this latter instance, the epitaxial layer is grown to have (100) surface since etching usually will reveal (111) surfaces.

Figure 12E:
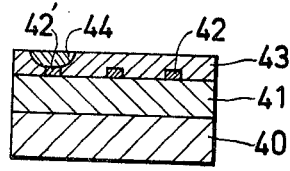

Then, another epitaxial layer 43 is grown on the regions 42 and 41 by vapor deposition. On a portion 42' of the gate region is formed a p-type doped region 44 to lead out the gate region to the surface (FIG. 12e). Then electrodes 51, 52 and 53 are formed on the respective regions to form the structure of FIG. 11.

According to the method of epitaxially growing the gate region, the channel length $l$ can be made shorter.

Examples of dimensional parameters of the above embodiments are as follows.

Example 1 (diffused gate region)

When $a \doteq 7\mu m$, $l \doteq 10\mu m$ and $T_D \doteq 25\mu m$, the amplification factor $\mu \doteq 9$, the drain resistance $r_D \doteq 8\Omega$, and the transconductance $g_m \doteq 1.2$ .

Example 2 (diffused gate region)

When $a \doteq 7\mu m$, $l \doteq 10\mu m$ and $T_D \doteq 20\mu m$, $\mu \doteq 5$, $r_D \doteq 5\Omega$ and $g_m \doteq 1.0$ .

Example 3 (diffused gate region)

When $a \doteq 4\mu m$, $l \doteq 10\mu m$ and $T_D \doteq 30\mu m$ in a smaller chip, $\mu \doteq 30$, $r_D \doteq 1k\Omega$ and $g_m \doteq 30m$ .

Example 4 (epitaxial gate region)

When $a \doteq 9\mu m$, $l \doteq 8\mu m$ and $T_D \doteq 25\mu m$, $\mu \doteq 6$, $r_D \doteq 5\Omega$ and $g_m \doteq 1.2$ .

The values of $a$ and $l$ are, practically, related to each other. When $a$ is desired to be small, control of $a$ only by mask dimensions is difficult and may be done through the control of diffusion time. Then, $l$ naturally takes a large value.

Figure 13:
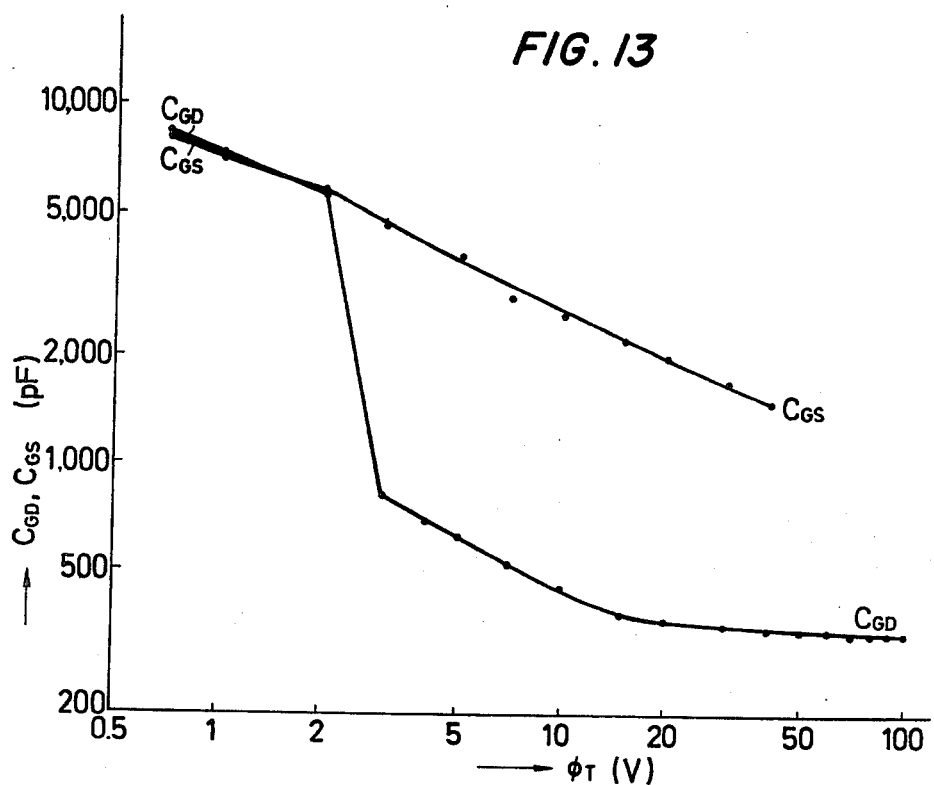
FIG. 13 is a graph showing the variations of gate-source and gate-drain capacitance with respect to the total potential difference across the junction.

The growth of the depletion layer and the closing of the current path can be readily recognized from the capacitance variations in FIG. 13. In this figure, the ordinate represents capacitance in pF and the abscissa represents the total potential difference (built-in voltage + applied voltage), letter $C_{GS}$ represents the capacitance between the source and the gate and $C_{GD}$ the capacitance between the gate and the drain. Plots are taken at 1MHz. As the potential increases, the capacitances decrease. From about 2 volts, the gate-to-drain capacitance will show a markedly rapid decrease. This means the closure of the current path and a rapid decrease in the area of the depletion layer surface on the drain side. It is seen that no anomalous change exists in the $C_{GS}$ curve.

Figure 14A:
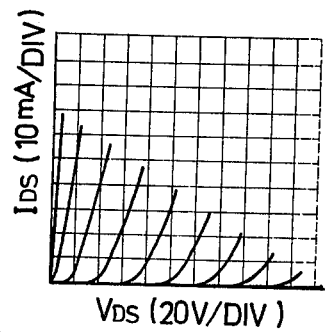
FIGS. 14a to 14c are drain current vs. drain voltage characteristics according to the embodiments of FIGS. 7 and 11.
Figure 14B:
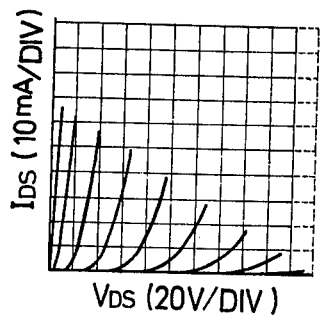
Figure 14C:
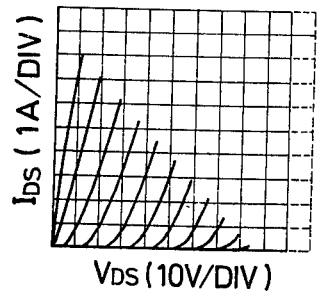

Characteristic curves according to the above embodiments are shown in FIGS. 14a to 14c. FIG. 14a is the case when $T_D + \frac{1}{2}l \doteq 30\mu m$, and FIG. 14b is the case when $T_D + \frac{1}{2}l \doteq 200\mu m$. FIG. 14c is the case where the channel width $a$ is set large to allow a large power.

The numerical range of $1 \times 10^{13}$ to $1 \times 10^{15}$ atoms/c.c. for the impurity concentration of the channel region and the numeral range of 2 to $10\mu m$ for the channel width $a$ will provide good characteristics. For producing specially excellent characteristics mainly for the use in audio instruments, an impurity concentration from $5 \times 10^{13}$ to $5 \times 10^{14}$ atoms/c.c. and a channel width $a$ from 3 to $10\mu m$ are recommended.

Figure 15:
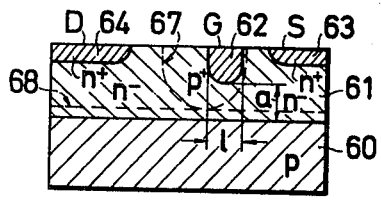
FIG. 15 is a cross-sectional view of an embodiment of the unsaturated type lateral field effect transistor according to this invention.
Figure 16:
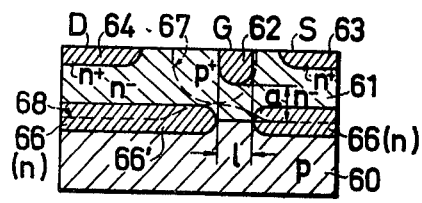
FIG. 16 is a cross sectional view of another embodiment of the unsaturated type lateral field effect transistor according to this invention.

The present invention is not limited to the vertical type field effect transistor but is applicable to the lateral type field effect transistor also. FIGS. 15 and 16 show horizontal type embodiments.

In FIG. 15, an $n^-$ type epitaxial layer 61 having an impurity concentration $5 \times 10^{13}$ to $5 \times 10^{14}$ atoms/c.c. is grown on a p-type substrate 60. This p-type substrate may form a second gate region. A p-type gate region 62 is formed by diffusion from the surface of the epitaxial layer 61. Heavily doped n-type regions 64 and 65 are formed beneath the source and the gate electrodes to provide low resistance ohmic contact. The edge of the depletion layers are shown by dotted lines 67 and 68. The impurity concentration and the channel width $a$ are selected in a manner similar to that described in the foregoing embodiments. According to the present invention, the channel width $a$ is selected below 10 $\mu m$ but broader than the width of conventional lateral type field effect transistors, due to the relatively low impurity concentration of the channel region, as in the preceding embodiment.

FIG. 16 shows another lateral type field effect transistor, in which n-type doped region 66 is formed in a p-type substrate 60 by diffusion so as to leave a protrusion of a p-type region beneath the gate region. Thus, the second gate region is noted to be of a locally depressed shape and the distance between the drain and the substrate junction surface 66' is decreased to improve the breakdown voltage. Further, the series resistance between the source and the drain can be reduced to improve the transconductance.

Figure 17A:
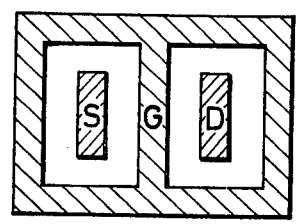
FIGS. 17a and 17b are top view patterns of the source-gate-drain arrangement to be employed in the embodiments of FIGS. 15 and 16.
Figure 17B:
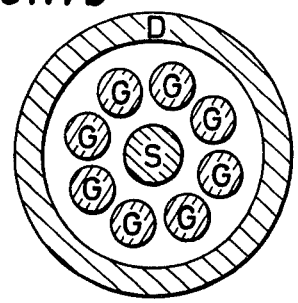

FIGS. 17a and 17b show typical examples of the source-gate-drain arrangement for the lateral type as shown in FIGS. 15 and 16. While FIGS. 15 and 16 show cross sections of one channel, the respective regions may be arranged in a plural channel fashion as shown in FIGS. 17a and 17b.

Figure 18:
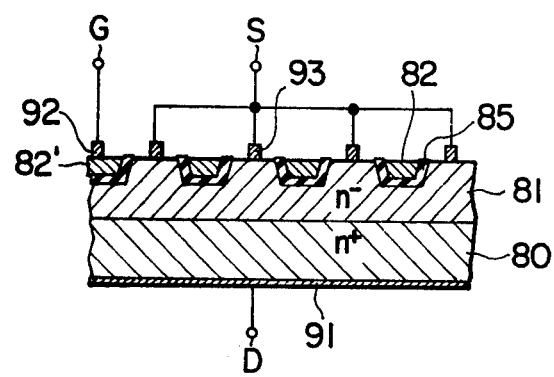
FIG. 18 is a cross sectional view of a further embodiment of the unsaturated type vertical field effect transistor according to this invention.

Although the embodiments described hereinabove are all of a junction gate type, this invention provides unsaturated type field effect transistors of an insulator gate type. In FIG. 18, a gate region is constituted by a gate electrode 82 made of e.g. poly-silicon or metal and an insulator film 85 of e.g. 0.2 $\mu m$ thick covering the gate electrode. Depletion layers grow from the junction between the insulator 85 and the semiconductor bulk 81 into the latter. A drain electrode 91 is attached under a substrate 80. Source electrodes 93 are provided on the channel region of the semiconductor bulk 81, and a gate electrode 92 is connected on the gate lead-out region 82'. Since this embodiment is of an n-channel type of a depletion mode, a negative voltage is applied to the gate and a positive voltage is applied to the drain, whereby a positive-going change of the gate voltage increase the drain current and a negative-going change decreases the drain current.

Figure 19:
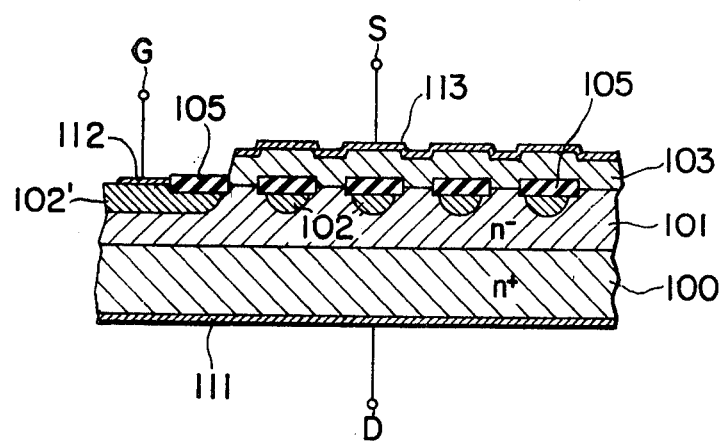
FIG. 19 is a cross sectional view of a still further embodiment of the unsaturated type vertical field effect transistor according to this invention.

In FIG. 19, a gate region is constituted by a $p^+$ type semiconductor portion 102 and an insulator film 105 of, for example, 0.2 $\mu m$ thick covering the semiconductor portion 102. This insulator film 105 serves to separate the gate semiconductor portion 102 from a source region 103 made of, for example, polysilicon. Depletion layers grow from the junction between the gate semiconductor portion 102 and a semiconductor bulk 101 into the latter. A drain electrode 111 is attached beneath a substrate 100. A source electrode 113 is deposited on the source region 103, and a gate electrode 112 is connected on the gate lead-out region 102'. The source region 103 may be omitted and a source electrode 113 may be connected directly to the semiconductor bulk 101 and the insulator film 105. This embodiment is also of an n-channel type of a depletion mode and the operation thereof is same as that described above. The embodiments of FIGS. 18 and 19 having an insulator film in the gate region exhibit a remarkably reduced capacitance between the regions.

We claim:

1. A field effect transistor comprising:
    a source electrode, a gate electrode and a drain electrode,
    a first semiconductor region of a first conductivity type connecting said source and drain electrodes, and
    at least two gate semiconductor regions of a second conductivity type relatively disposed in said first semiconductor region such that a common plane passes centrally through said gate region with said gate regions extending outwardly on either side of said plane a predetermined distance, adjacent boundaries of said gates being separated in said plane by a distance ranging from 15 to 2.0μm,
    said gate regions defining a channel region within said first semiconductor region,
    said channel region being those portions of said first semiconductor region located between adjacent ones of said gate regions and extending outwardly on either side of said plane said predetermined distance, the width of said channel region being defined by the separation in said plane of said adjacent gate region boundaries and the length of said channel region being defined by said predetermined distance on either side of said plane,
    said channel region having an impurity concentration of from $1 \times 10^{13}$ to $1 \times 10^{15}$ atoms/cc, and
    a depletion layer growing from the junction between said gate semiconductor region and said first semiconductor region to almost close said channel region when no gate bias voltage is applied to said gate electrode to cause the transistor to provide an unsaturated drain current versus drain voltage characteristic.

2. A field effect transistor according to claim 1, in which said channel region includes an impurity concentration between $5 \times 10^{13}$ and $5 \times 10^{14}$ atoms/c.c.

3. A field effect transistor according to claim 1, in which said width of the channel region is between 3 and 10 μm.

4. A field effect transistor according to claim 2, in which said width of the channel region is between 3 and 10 μm.

5. A field effect transistor according to claim 1, in which said gate region includes an epitaxially grown layer.

6. A field effect transistor according to claim 1, in which said semiconductor region comprises two portions, one being located between said channel region and said drain electrode and having an impurity concentration of between $5 \times 10^{13}$ to $5 \times 10^{14}$ atoms/c.c. and the other being located between said channel region and said source electrode and having an impurity concentration not lower than that of said one portion.

7. A field effect transistor according to claim 1, in which the ratio of width to length of said channel region is between 0.1 and 10.

8. A field effect transistor according to claim 1, in which said source, gate and drain electrodes are formed on one principal surface of the transistor and said channel region is parallel to said one principal surface.

9. A field effect transistor according to claim 1, in which said gate region includes an insulator region surrounding at least a portion of said gate semiconductor region.

10. A field effect transistor according to claim 1 in which at least one of said gate regions has a mesh structure to leave a multiplicity of channels, and said common plane is parallel to a principal surface of the transistor.

11. A field effect transistor comprising:
    a source electrode, a gate electrode and a drain electrode,
    a first semiconductor region of a first conductivity type connecting said source and drain electrodes, and
    at least two gate semiconductor regions of a second conductivity type, adjacent boundaries thereof being separated by a distance ranging from 15 to 2.0μm,
    said gate regions defining a channel region within said first semiconductor region,
    said channel region being those portions of said first semiconductor region located between adjacent ones of said gate regions disposed in the direction perpendicular to a first plane defined by said source electrode and drain electrode, and between second and third parallel planes respectively tangential to opposite boundaries of at least one of said gate semiconductor region and perpendicular to said first plane,
    said channel region having an impurity concentration of from $1 \times 10^{13}$ to $1 \times 10^{15}$ atoms/cc, and
    a depletion layer growing from the junction between said gate semiconductor region and said first semiconductor region to almost close said channel region when no gate bias voltage is applied to said gate electrode to cause the transistor to provide an unsaturated drain current versus drain voltage characteristic.

12. A field effect transistor comprising:
    a source electrode, a gate electrode and a drain electrode,
    a first semiconductor region of a first conductivity type connecting said source and drain electrodes, and
    at least two gate semiconductor regions of a second conductivity type, adjacent boundaries thereof being separated by a distance ranging from 15 to 2.0μm,
    said gate regions defining a channel region within said first semiconductor region,
    said channel region being those portions of said first semiconductor region located between adjacent ones of said gate regions arranged in the direction perpendicular to a first plane defined by said source electrode and drain electrode, and between second and third parallel planes respectively tangential to opposite boundaries of at least one of said gate semiconductor regions and perpendicular to a first plane, and between fourth and fifth parallel planes respectively tangential to opposite boundaries of said at least one gate semiconductor region and perpendicular to said second and third planes,
    said channel region having an impurity concentration of from $1 \times 10^{13}$ to $1 \times 10^{15}$ atoms/cc, and
    a depletion layer growing from the junction between said gate semiconductor region and said first semiconductor region to almost close said channel region when no gate bias voltage is applied to said gate electrode to cause the transistor to provide an unsaturated drain current versus drain voltage characteristic.

* * * * *